(12) United States Patent
Kaveh

(10) Patent No.: US 7,616,442 B1
(45) Date of Patent: Nov. 10, 2009

(54) POWER ELECTRONIC MODULE COOLING SYSTEM AND METHOD

(75) Inventor: Mehdi Kaveh, Brown Deer, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 6 days.

(21) Appl. No.: 12/109,849

(22) Filed: Apr. 25, 2008

(51) Int. Cl.
*H05K 7/20* (2006.01)

(52) U.S. Cl. .............. 361/697; 361/690; 361/695; 174/16.1; 174/16.3; 165/80.3

(58) Field of Classification Search ............. None
See application file for complete search history.

(56) References Cited

U.S. PATENT DOCUMENTS

| | | | |
|---|---|---|---|
| 6,466,441 B1 * | 10/2002 | Suzuki | 361/695 |
| 6,515,858 B2 * | 2/2003 | Rodriguez et al. | 361/695 |
| 6,621,700 B1 * | 9/2003 | Roman et al. | 361/697 |
| 6,665,183 B1 * | 12/2003 | Shikata et al. | 361/697 |
| 6,891,725 B2 * | 5/2005 | Derksen | 361/704 |
| 7,027,300 B2 * | 4/2006 | Lord | 361/695 |
| 7,054,157 B2 * | 5/2006 | Hirota et al. | 361/695 |
| 2002/0036889 A1 * | 3/2002 | Ruiz-Gomez et al. | 361/695 |

\* cited by examiner

*Primary Examiner*—Boris L Chervinsky
(74) *Attorney, Agent, or Firm*—Fletcher Yoder Law; Alexander R. Kuszewski

(57) ABSTRACT

An improved cooling mechanism for a power electronics device is provided. More specifically, a cooling mechanism is provided wherein an air directing structure with a finite airflow resistance is deployed in a cooling channel adjacent to a heatsink in a first cooling zone, such that some portion of the cooling air is forced through the heatsink while the rest of the cooling air bypasses the heatsink to provide additional cooling air to a second cooling zone. Additionally, the air-flow resistance of the air directing structure can be chosen so that the fan operates at its optimal point (maximum power input to the air).

20 Claims, 5 Drawing Sheets

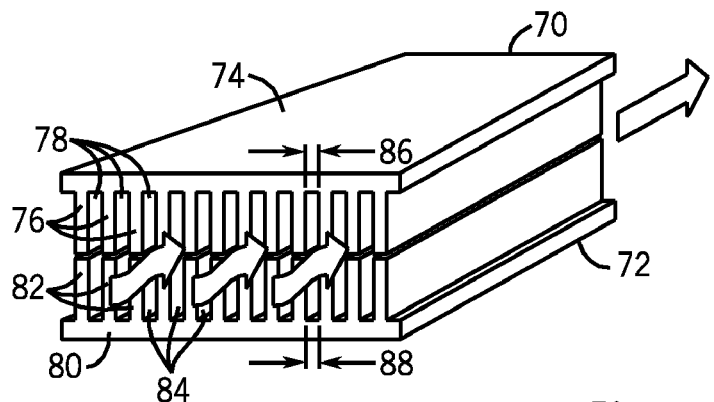
FIG. 4
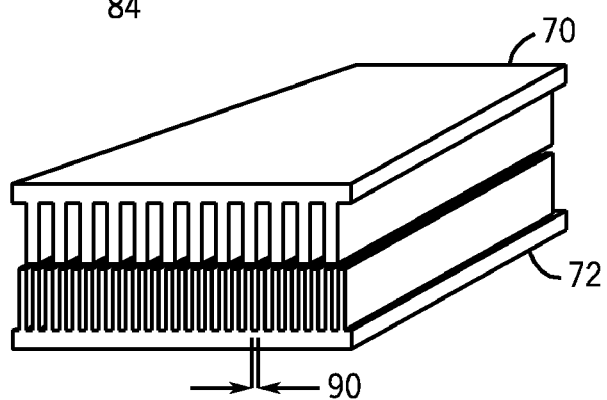
FIG. 5
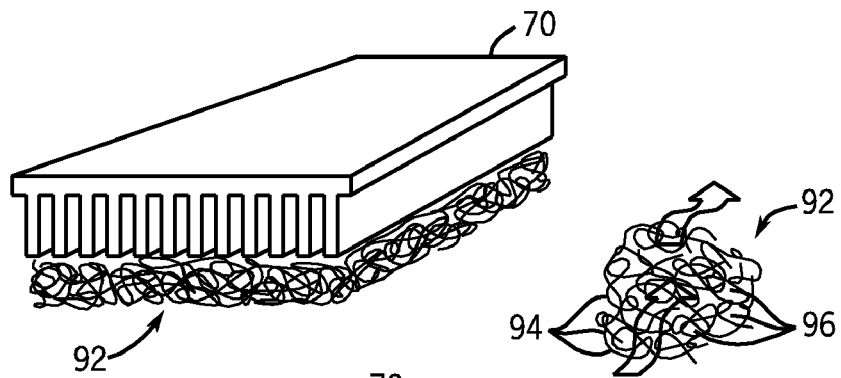
FIG. 6
FIG. 7
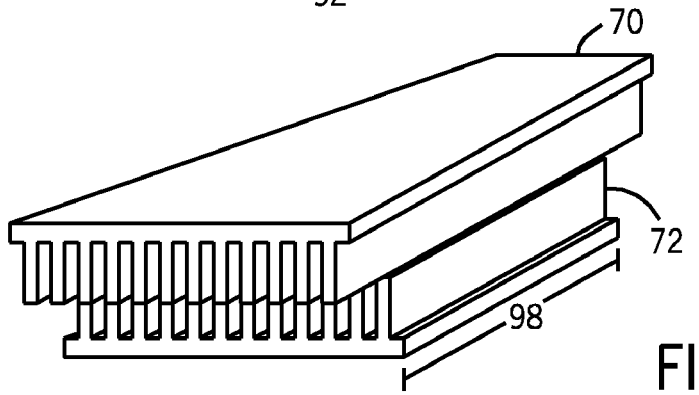
FIG. 8

POWER ELECTRONIC MODULE COOLING SYSTEM AND METHOD

BACKGROUND

The invention relates generally to the field of power electronic devices such as those used in power conversion or applying power to motors and similar loads. More particularly, the invention relates to a motor drive with an improved cooling arrangement which provides enhanced air flow characteristics and enhanced heat dissipation.

In the field of power electronic devices, a wide range of circuitry is known and currently available for converting, producing and applying power to loads. Depending upon the application, such circuitry may convert incoming power from one form to another as needed by the load. In a typical arrangement, for example, constant (or varying) frequency alternating current power (such as from a utility grid or generator) is converted to controlled frequency alternating current power to drive motors, and other loads. In this type of application, the frequency of the output power can be regulated to control the speed of the motor or other device. Many other applications exist, however, for power electronic circuits which can convert alternating current power to direct current power, or vice versa, or that otherwise manipulate, filter, or modify electric signals for powering a load. Circuits of this type generally include rectifiers (converters), inverters, and similar switched circuitry. For example, a motor drive will typically include a rectifier that converts AC power to DC. Often power conditioning circuits, such as capacitors and/or inductors, are employed to remove unwanted voltage ripple on the internal DC bus. Inverter circuitry can then convert the DC signal into an AC signal of a particular frequency desired for driving a motor at a particular speed. The inverter circuitry typically includes several high power switches, such as insulated-gate bipolar transistors (IGBTs), controlled by drive circuitry.

The motor drive circuitry detailed above will typically generate substantial amounts of heat, which must be dissipated to avoid damaging heat sensitive electronics. Typically, therefore, some form of cooling mechanism is usually employed to enhance heat extraction and dissipation. Often, the motor drive circuitry is packaged together as a unit with a built-in cooling channel that carries cool air to several components. Because the air within the channel is heated as it travels through the channel, components near the exhaust end of the air channel will usually experience a diminished cooling effect. Therefore, as packaged control units become more compact, the need for efficient heat dissipation becomes more critical.

Additionally, as the workload or motor speed changes, the temperature of the IGBTs generally increases, causing higher failure rates and reduced reliability. The output of the unit is often, therefore, limited by the maximum temperature that the unit can handle without substantially increasing the risk of failure. A more effective cooling mechanism would, therefore, allow the motor drive to operate at higher motor speeds.

Therefore, it may be advantageous to provide a motor drive with an improved cooling mechanism. In particular, it may be advantageous to provide a cooling mechanism which provides a reduced air-flow resistance and increased air flow while maintaining a high level of thermal performance.

BRIEF DESCRIPTION

The present invention relates generally to a cooling configuration designed to address such needs. One embodiment of the present invention employs an air directing structure deployed adjacent to a heatsink, such that the air directing structure urges air to pass through a heatsink thermally coupled to power electronic circuitry, but also allows cooling air to bypass the heatsink and flow to a region of the cooling channel adjacent to the power conditioning circuitry.

Another embodiment of the present invention employs an air directing structure deployed adjacent to a heatsink in a first cooling zone, such that the air directing structure allows cooling air to pass through the air directing structure to a second cooling zone.

In another embodiment of the present invention, the heat dissipating structure is chosen to provide a near-optimal thermal conductivity, while the air-flow resistance of the air directing structure is selected to cause the fan to operate at or near its optimal point.

DRAWINGS

These and other features, aspects, and advantages of the present invention will become better understood when the following detailed description is read with reference to the accompanying drawings in which like characters represent like parts throughout the drawings, wherein:

FIG. 4 is a perspective view of an exemplary air directing structure adjacent to an exemplary heatsink, illustrating the flow path of cooling air through a cooling channel.

FIG. 5 is a perspective view of an alternate embodiment of an air directing structure, in which the air directing structure employs a narrower fin spacing.

FIG. 6 is a perspective view of an alternate embodiment of an air directing structure, in which the air directing structure includes a mesh.

FIG. 7 is a perspective view of the mesh-style air directing structure shown in FIG. 6, illustrating the air flow through the mesh.

FIG. 8 is a perspective view of an alternate embodiment of an air directing structure, in which the air directing structure is shorter than the adjacent heatsink.

DETAILED DESCRIPTION

Figure 1:
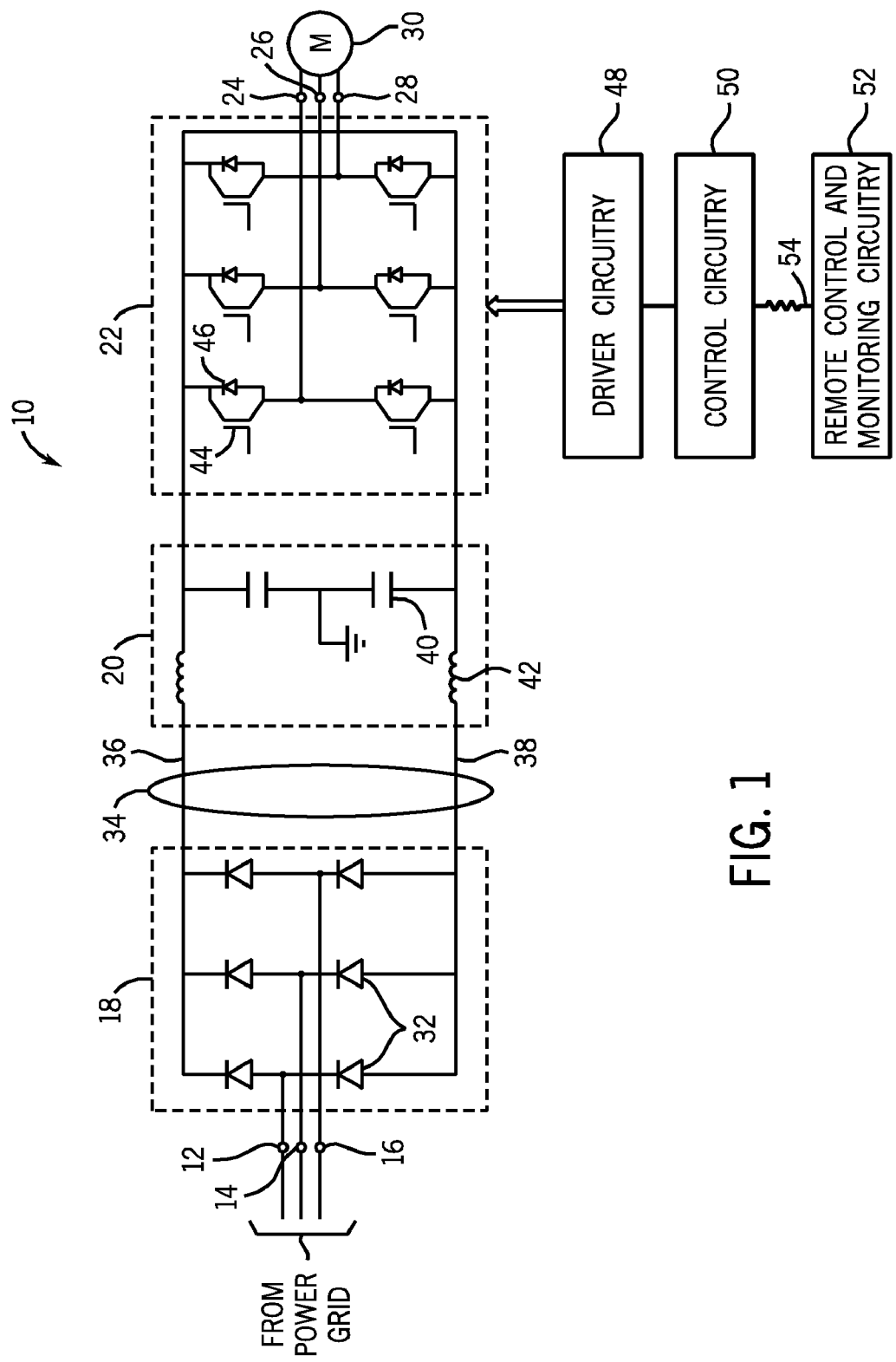
FIG. 1 is a diagrammatical representation of an exemplary motor drive circuit in accordance with one embodiment of the present invention.

FIG. 1 is a diagrammatical representation of an exemplary motor drive circuit 10 employing an air directing structure for providing enhanced cooling of the motor drive circuitry. The motor drive circuit 10 includes a three phase power source electrically coupled to a set of input terminals 12, 14 and 16 that provides three phase AC power of constant frequency to a rectifier circuitry 18. In the rectifier circuitry 18, a set of six diodes 32 provide full wave rectification of the three phase voltage waveform. Each input terminal entering the rectifier circuitry 18 is coupled between two diodes 32 arranged in series, anode to cathode, which span from the low side 38 of the DC bus 34 to the high side 36 of the DC bus 34. Inductors 42 are coupled to both the high and low sides of the DC bus 34 and act as a choke for smoothing the rectified DC voltage waveform. Capacitors 40 link the high side 36 of the DC bus 34 with the low side 38 of the DC bus 34 and are also configured to smooth the rectified DC voltage waveform. Together, the inductors and capacitors serve to remove most of the AC ripple presented by the rectifier circuitry 18 so that the DC bus 34 carries a waveform closely approximating a true DC voltage. It should be noted that the three-phase implementation described herein is not intended to be limiting, and the invention may be employed on single-phase circuitry, as well as on circuitry designed for applications other than motor drives.

An inverter 22 is coupled to the DC bus 34 and generates a three phase output waveform at a desired frequency for driving a motor 30 connected to the output terminals 24, 26 and 28. Within the inverter 22, two switches 44 are coupled in series, collector to emitter, between the high side 36 and low side 38 of the DC bus 34. Three of these switch pairs are then coupled in parallel to the DC bus 34, for a total of six switches 44. Each switch 44 is paired with a flyback diode 46 such that the collector is coupled to the anode and the emitter is coupled to the cathode. Each of the output terminals 24, 26 and 28 is coupled to one of the switch outputs between one of the pairs of switches 44. The driver circuitry 48 signals the switches 44 to rapidly close and open, resulting in a three phase waveform output across output terminals 24, 26 and 28. The driver circuitry 48 is controlled by the control circuitry 50, which responds to the remote control and monitoring circuitry 52 through the network 54.

Those of ordinary skill in the art will recognize that many of the circuit components depicted in FIG. 1 will generate significant amounts of heat, which can lead to component failure due to overheating. Furthermore, as the speed of the motor 30 is changed, and depending upon load conditions, the circuit components, such as the switches 44, will generate considerable heat. Depending upon the switching scheme, more heat may be generated during high speed or low speed operation (due to longer or shorter "on times" of the switches, switching losses, and so forth). Therefore, it is often the case that the performance of the motor control circuit 10 is limited by the ability of the motor control circuit 10 to dissipate heat. Therefore, the motor control circuit 10 will usually be packaged within a unit that includes a system for dissipating heat as quickly as possible.

Figure 2:
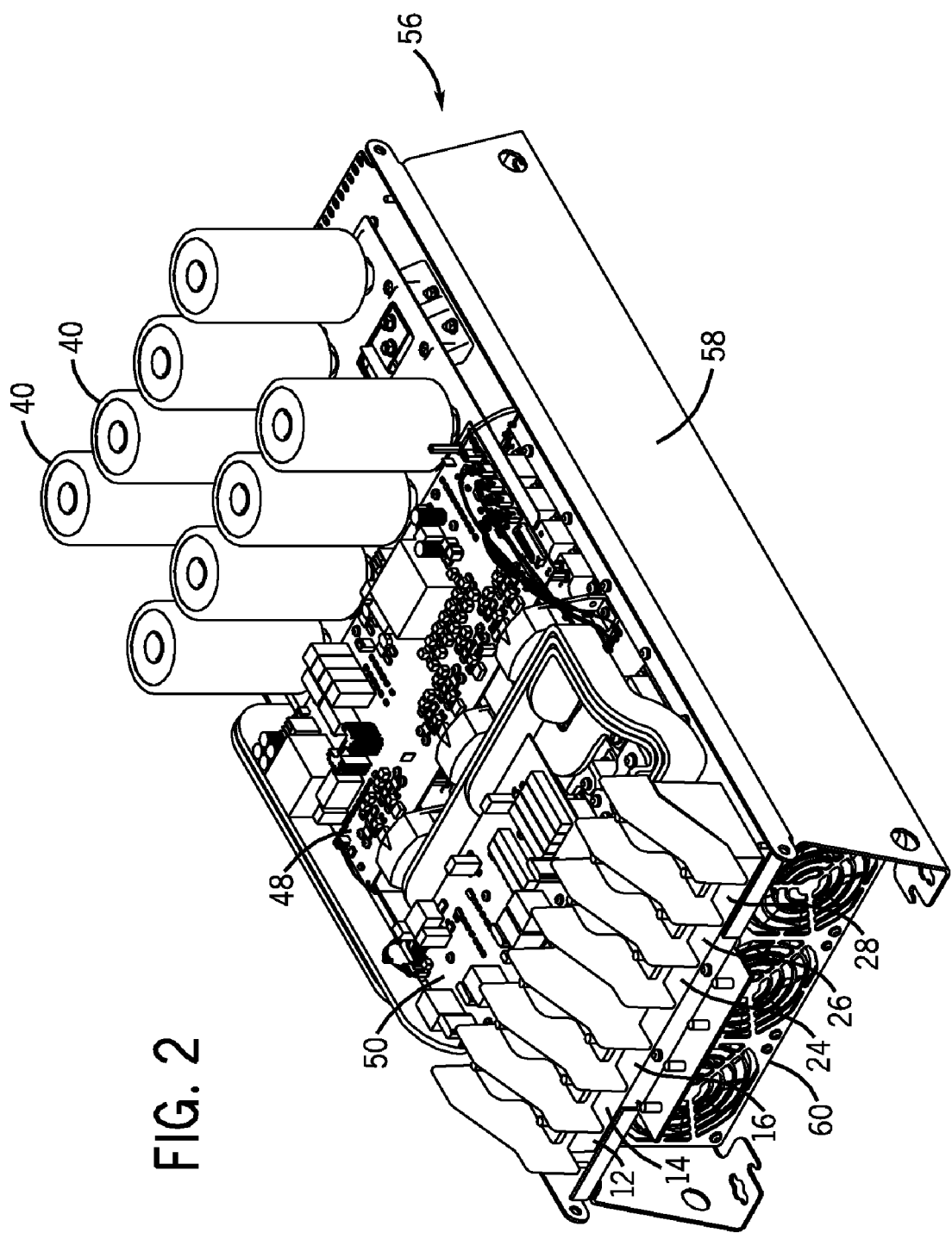
FIG. 2 is a perspective view of an exemplary motor drive unit in accordance with one embodiment of the present invention.

Turning now to FIG. 2, a perspective view of an exemplary motor drive unit in accordance with one embodiment of the present invention is shown. The motor drive unit 56 includes a cooling channel 58 enclosed by side plates. The motor drive unit 56 also includes a set of fans 60 to provide a flow of cooling air through the cooling channel 58. The driver circuitry 48 and the control circuitry 50 are situated above and adjacent to the cooling channel 58 so that the flow of cool air draws heat from the circuitry. Also adjacent to the cooling channel 58 are capacitors 40, which make up part of the DC power conditioning circuitry.

Figure 3:
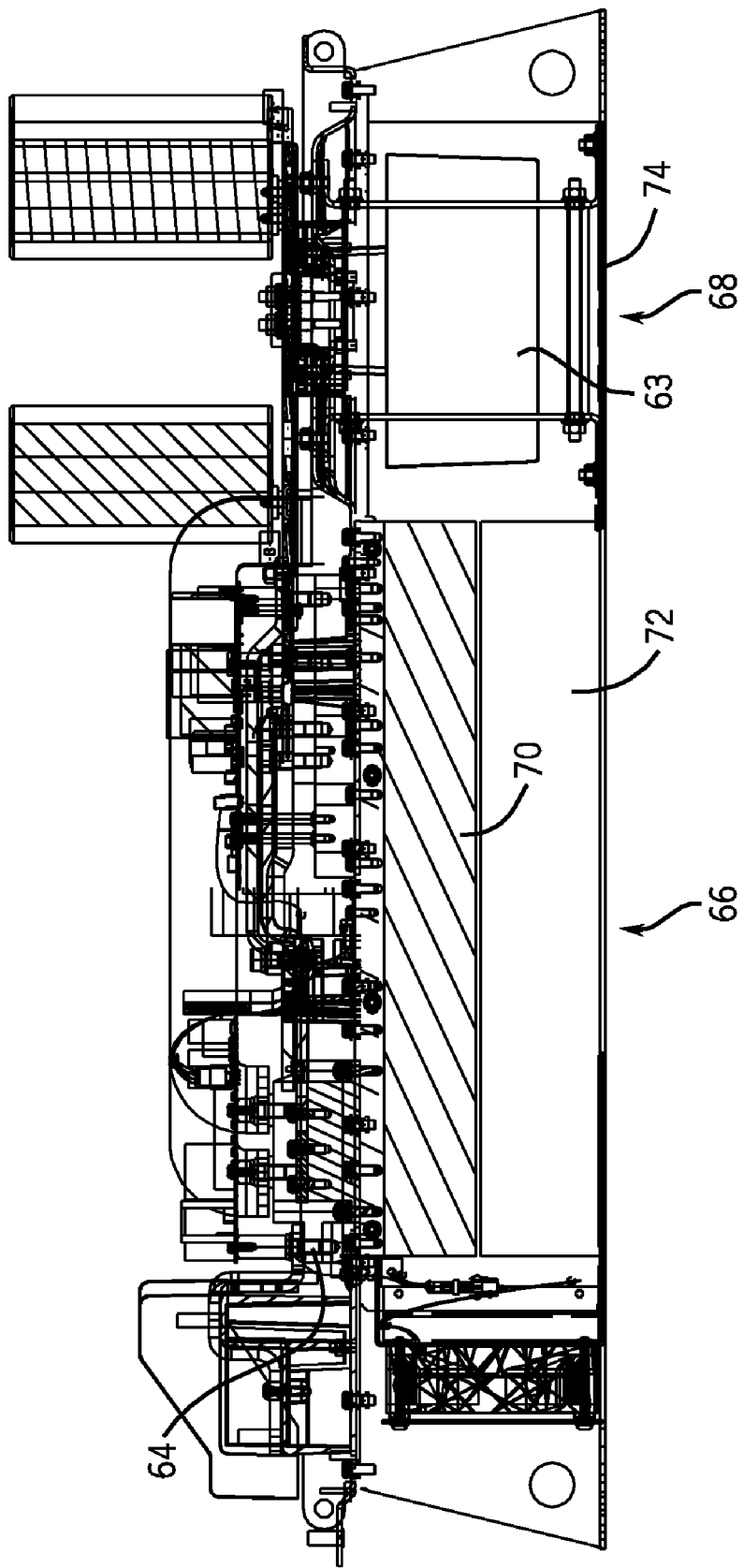
FIG. 3 is a perspective sectional view of the motor drive circuit shown in FIG. 2, illustrating a cooling channel with an exemplary air directing structure.

FIG. 3 is a perspective sectional view of the control unit 56, and provides a better view of cooling channel 58. As can be seen in FIG. 3, the cooling channel 58 includes a first zone 66 and a second zone 68. The first zone 66 includes a heatsink 70, mounted below a lower plate 64 adjacent to the driver circuitry 48 and the control circuitry 50. Also in the first zone is an air directing structure 72 adjacent to the heatsink 70 and that occupies all or at least part of the remaining space inside the first zone 66 of the cooling channel 58. The second zone 68 is situated at the exhaust point of the first zone 66. The second zone 68 is occupied by a choke 63 that operates in concert with the capacitors 40 to remove unwanted ripple in the DC bus. The degree of cooling provided for components adjacent to the first zone 66, such as rectifier 18 and inverter 22, depends on the thermal conductivity of the heatsink 70 and the level and nature of the air flow passing through the heatsink 70 (e.g., the flow regime, temperature, etc.). The degree of cooling provided for components in the second zone 68, such as the choke 63 and the capacitors 40, depends on the overall level and nature of the air flow passing through the cooling channel 58 and the temperature of the air when it reaches the second zone 68, after drawing heat from the first zone 66.

In embodiments of the present invention, cooling air is forced by the fans 60 into the cooling channel 58, at which point, some of the air passes through the heatsink 70, while some portion of air flows through the air directing structure 72. The air directing structure 72 provides a selected resistance to air flow that determines what portion of air will flow through the heatsink as opposed to the air directing structure. In exemplary embodiments of the present invention, the airflow resistance of the air directing structure 72 is chosen so that the overall channel resistance causes the fan or fans to operate at or near its optimal point, as will be explained in more detail below. The air that passes through the heatsink 70 will draw heat from the rectifier and the inverter circuitry 10 before passing into second zone 68 where the cooling air flow will provide additional cooling to the choke 63. Because the air is warmer when it reaches the second zone 68, the cooling capacity of the air flowing through the heatsink 70 is reduced when it reaches the second zone 68. The air that passes through the air directing structure 72 will, however, remain relatively cool because the air directing structure 72 is not significantly thermally coupled to the heatsink 70. The air that reaches the second zone through the air directing structure 72 will, therefore, provide significant additional cooling air to the choke 63.

It should also be noted that in embodiments of the present invention, the heatsink 70 and the air directing structure 72 are fluidly coupled along the adjacent surfaces between the heatsink 70 and the air directing structure 72. There may, therefore, be some passage of warm air across the border between the heatsink 70 and the air directing structure 72. This cross flow will usually be small, however, compared to the longitudinal air flow, i.e. down the length of the cooling channel 58. In alternate embodiments, the heatsink 70 and the air directing structure 72 are not fluidly coupled along the adjacent surfaces between the heatsink and the air directing structure. Rather, some physical barrier is imposed between the heatsink 70 and the air directing structure 72 such that cross flow is essentially eliminated.

FIG. 4 is a perspective view of an air directing structure 72 adjacent to a heatsink 70, in accordance with an embodiment of the present invention. The heatsink 70 includes a base plate 74 and fins 76 coupled to the base plate 74, with air flow channels 78 situated between the fins 76. The heatsink 70 may be made of any thermally conductive material known in the art, such as, for example, copper, aluminum or other metals and composite material. The overall thermal conductivity of the heatsink 70 will be determined by the type of material used, the thickness of the fins 76, the quantity of fins 76 and the spacing 86 between the fins 76. The heatsink 70 may be employed adjacent to heat generating electronics, such as heat generating electronics found in a rectifier.

In this embodiment, the air directing structure 72 includes a base 80 and fins 82 coupled to the base 80 with flow channels 84 between the fins 82. In certain embodiments of the present invention, the air directing structure 72 may be made of a low thermal conductivity material, such as, for example, a moldable plastic. The fin spacing 88 is chosen to decrease the overall system air flow resistance of the cooling channel 58 and to provide a desired level of additional air flow. Air, depicted by arrows, flows through the channels provided by the heatsink 70 and the air directing structure 72 and exits at the other end. In one embodiment, the spacing 86 between the fins 76 of the heatsink 70 equals the spacing 88 between the fins 82 of the air directing structure 72. In that embodiment, the heatsink 70 and the air directing structure 72 may present generally equal air flow resistance and may pass equal amounts of air. However, the present invention is not limited to configurations in which the heatsink 70 and the air directing structure 72 present equal air flow resistances. Rather, in some embodiments, the air flow resistance of the heatsink 70 and the air directing structure 72 may be substantially different so as to direct appropriate amounts of air to cool the first zone and the second zone. For example, in certain embodiments, the fin geometry of the heatsink 70 is chosen to maximize thermal conductance, while the geometry of the air directing structure 72 is chosen to provide the optimal overall system air flow resistance, as will be detailed further below.

It should be appreciated that the present invention may be embodied in a wide variety of configurations. For example, the fins of the heatsink 70 and the air directing structure 72 may be the same length or different lengths. Additionally, the fins of the heatsink 70 and the air directing structure 72 could be fluidly coupled as shown in FIG. 4 or alternatively, a barrier, such as the base plate 74 or base 80, could be interposed between the heatsink 70 and the air directing structure 72 to eliminate or reduce the amount of air flowing between the two structures.

FIG. 5 depicts an embodiment of an air directing structure in accordance with the present invention. The air directing structure 72 depicted in FIG. 5 employs a larger number of fins and a decreased fin spacing 90. By increasing the width of the fins, and reducing the spacing 90, the width of the air channels can be reduced, thereby increasing the air flow resistance of the air directing structure 72 and forcing more air to flow through the heatsink 70 as compared to the air directing structure 72. Increasing the air-flow resistance of air directing structure 72 will also increase the overall air-flow resistance and reduce the overall air flow through cooling channel 58.

FIG. 6 depicts an embodiment of the present invention in which the air directing structure is a mesh. The mesh 92 may be a mesh of any convenient and inexpensive material, such as for example, metal wire, or synthetic fibers. Referring to FIG. 7, the mesh 92 includes a mesh material 94 with interstices 96 between the mesh material 94 that allow air to flow through the mesh 92. It can easily be seen that compressing the mesh 92 will decrease the size of the interstices 96 and thereby increase the air flow resistance of the mesh 92.

FIG. 8 depicts yet another embodiment of the present invention, in which the length 98 of the air directing structure 72 differs from the length of the heatsink 70. It will be appreciated by those of ordinary skill in the art that changing the length 98 of the air directing structure 72 will change the air flow resistance presented by the air directing structure 72. The length 98 can, therefore, be selected to provide a desired level of air flow resistance. It should also be appreciated that the air directing structure 72 could alternatively be chosen to be longer than the heatsink 76.

The configurations shown by the above figures are intended as exemplary embodiments of an air directing structure in accordance with the present invention. It should be appreciated that alternative embodiments, not depicted, may nevertheless fall within the scope of the present invention as defined by the claims.

Figure 9:
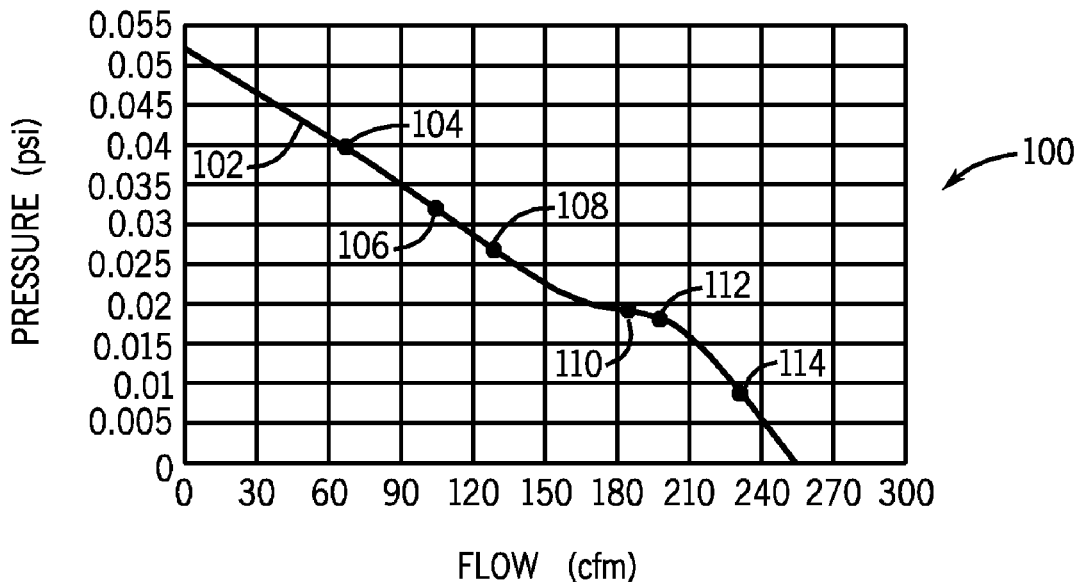
FIG. 9 is a graphical representation of the air flow versus air pressure provided by a fan, illustrating the present technique for increasing cooling air flow through a cooling channel of a motor drive.
Figure 10:
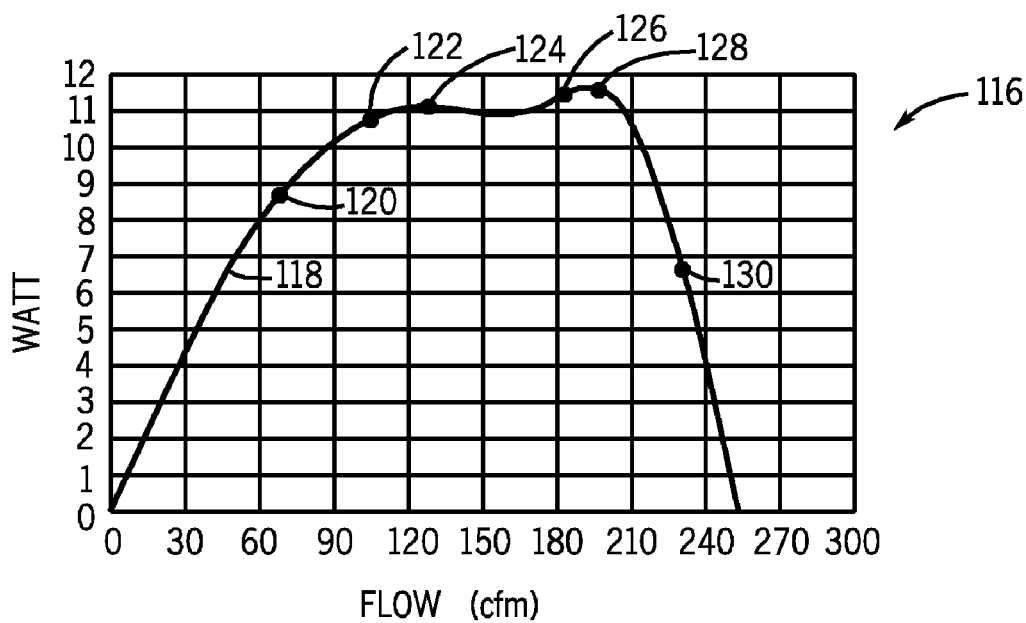
FIG. 10 is a graphical representation of the air flow provided by a fan, illustrating the present technique for optimizing the fan performance of a fan employed for cooling a motor drive.

In some embodiments of the present invention, the configuration of the heatsink 70 is chosen to provide optimal thermal conductivity for maximum cooling of components in the first zone 66, while the configuration of the air directing structure 72 is chosen so that the cooling channel 58 presents an optimal air-flow resistance to the fans 60. The optimal air-flow resistance is that which causes the fans 60 to operate at the optimal point (providing maximum power), thereby providing the maximum combined cooling effect for both the first zone 66 and the second zone 68. FIG. 9 and FIG. 10 illustrate the abovementioned technique.

FIG. 9 depicts a graphical representation of air flow versus air pressure for a particular a fan (or set of fans) operating at a particular rotational speed. The air flow through the cooling channel 58 is represented along the x-axis in cubic feet per minute (cfm). The pressure loss within the cooling channel 58 is represented along the y-axis in pounds per square inch (psi). As represented by trace 102, a fan will operate at a unique air pressure and air flow dependent upon the air flow resistance presented by the cooling channel 58. Data points 104, 106, 108, 110 and 114 represent the air flow and air pressure provided by the fan for cooling channel configurations with different air-flow resistances. Generally, it may be advantageous to operate the fan at or close to its optimal point (providing maximum power), which is represented by data point 112. At the fan optimal point, the cooling potential of the fan is maximized.

The fan optimal point is best illustrated by FIG. 10, which is a graphical representation of the air flow provided by the fan versus the output power of the fan. The output power of the fan represents the power provided by the fan to the air in the channel and is proportional to the product of the air pressure and the air flow rate. Generally, the higher the output power of the fan, the more cooling effect that the fan provides to the cooling channel. On the other hand, the amount of input power required to operate the fan remains relatively constant for any given rotational speed, decreasing slightly as the air pressure decreases. Therefore, the peak output power represented by data point 128 also represents the peak fan efficiency. Referring to both FIGS. 9 and 10, it should be noted that data points 120, 122, 124, 126, 128 and 130 in FIG. 10 correspond with data points 104, 106, 108, 110, 112 and 114 in FIG. 9, respectively.

Returning to FIG. 9, data points 104, 106, and 108 represent the operating conditions of a fan coupled to a cooling channel including a heatsink 70 and an air directing structure with infinite air flow resistance, such that all of the cooling air flows through the heatsink 70. With such an arrangement, an increase in the number of fins will generally cause an increase in the thermal conductivity of the heatsink by increasing the surface area of the heat dissipative surface. However, increasing the number of fins also reduces the airflow through the heatsink by increasing the air-flow resistance of the heatsink. The optimal fin arrangement will, therefore, result from a balancing of the thermal conductivity and the air flow through the heatsink.

Data points 104, 106 and 108 represent heatsinks with a 2.2 millimeter (mm), 4 mm and 6 mm fin spacing respectively.

The table below provides the relative temperature change of the electronics coupled to the different heatsink configurations represented by data points 104, 106 and 108:

| Fin Spacing | Air Flow | Temperature Change |
|---|---|---|
| 2.2 mm | 67 cfm @ 0.04 psi | REFERENCE |
| 4.0 mm | 104 cfm @ 0.032 psi | −3.2 deg C. |
| 6.0 mm | 127 cfm @ 0.027 psi | +6.5 deg C. |

As seen in table above, the optimal fin spacing of the heatsink 70, as evidenced by the 3.2 degree temperature drop, is close to 4 mm. As seen in FIG. 9, however, the air flow resistance provided by the 4 mm fin spacing (data point 106) is far from the optimal air-flow resistance needed to operate the fan at its peak efficiency (data point 112). In order to provide near optimal heatsink fin spacing and near optimal overall air flow resistance, the heat sink fin spacing is maintained at 4.0 mm to provide for near optimal cooling of the first zone, while the air flow resistance of the air directing structure 72 is selected to bring the overall air-flow resistance of the cooling channel 58 closer to the optimal value, i.e. peak fan efficiency point 112.

Referring again to FIG. 9, data point 110 represents the operating conditions of a fan coupled to a cooling channel 58 that includes a heatsink 70 and an air directing structure 72 with a finite air flow resistance, such that some portion of the cooling air flows through the heatsink 70, and some portion flows through the air directing structure 72. The fin spacing of the heatsink 70 at data point 110 is 4 mm, which, as discussed above, provides a thermal conductivity that is close to optimal. The air flow resistance of the air directing structure 72 is chosen so that the overall air-flow resistance of the cooling channel is close to the optimal value represented by data point 112. At data point 110, therefore, both the heatsink 70 and the fan operate at near optimal values. The result is that the air flow through the cooling channel is increased substantially while the temperature of components coupled to the heatsink 70 rises only modestly, 0.7 degrees Celsius compared to data point 104. The additional air flow then provides substantial additional cooling for components in the second zone 68.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A motor drive comprising:
   power electronic circuitry coupled to a DC bus and configured to generate drive signals for driving a motor;
   power conditioning circuitry coupled to the DC bus;
   a fan for directing a flow of cooling air through an air passageway;
   a heat dissipating structure thermally coupled to the power electronic circuitry and extending into the air passageway and cooled by the flow of cooling air from the fan; and
   an air directing structure disposed in the air passageway at least adjacent to the heat dissipating structure and configured to urge cooling air into contact with the heat dissipating structure, but to permit cooling air to flow to a region of the air passageway adjacent to the power conditioning circuitry.

2. The motor drive of claim 1, wherein the power electronic circuitry includes a rectifier.

3. The motor drive of claim 1, wherein the power electronic circuitry includes an inverter circuit.

4. The motor drive of claim 1, wherein the power conditioning circuitry includes a capacitive circuit configured to smooth power applied to the DC bus.

5. The motor drive of claim 1, wherein the air directing structure includes a plurality of fins disposed adjacent to fins of the heat dissipating structure.

6. The motor drive of claim 5, wherein the air directing structure is not conductively thermally coupled to the heat dissipating structure.

7. The motor drive of claim 5, wherein the air directing structure includes a moldable plastic element of which the plurality of fins are an integral part.

8. The motor drive of claim 1, wherein the air directing structure includes a mesh.

9. The motor drive of claim 1, wherein the air directing structure creates a resistance to air flow that favors flow of cooling air towards the heat dissipating structure, but that permits flow through the air directing structure to cool the power conditioning circuitry.

10. A motor drive comprising:
    power electronic circuitry coupled to a DC bus and configured to generate drive signals for driving a motor;
    power conditioning circuitry coupled to the DC bus;
    a heat dissipating structure thermally coupled to the power electronic circuitry for extracting heat from the power electronic circuitry during operation;
    a fan for directing a flow of cooling air through an air passageway having a first zone adjacent to the power electronic circuitry and a second zone adjacent to the power conditioning circuitry; and
    an air directing structure disposed in the air passageway and configured to urge cooling air into contact with the heat dissipating structure, but to permit cooling air to the second zone for cooling the power conditioning circuitry.

11. The motor drive of claim 10, wherein the air directing structure is disposed at least partially in the first zone.

12. The motor drive of claim 10, wherein the air directing structure includes a plurality of fins disposed adjacent to fins of the heat dissipating structure.

13. The motor drive of claim 12, wherein the air directing structure includes a moldable plastic element of which the plurality of fins are an integral part.

14. The motor drive of claim 10, wherein the air directing structure includes a mesh.

15. A motor drive comprising:
    power electronic circuitry coupled to a DC bus and configured to generate drive signals for driving a motor;
    power conditioning circuitry coupled to the DC bus;
    a fan for directing a flow of cooling air through an air passageway;
    a heat dissipating structure thermally coupled to the power electronic circuitry and configured to provide optimal or near optimal thermal conductivity; and
    an air directing structure disposed in the air passageway at least adjacent to the heat dissipating structure and configured to cause the fan to operate at or near the optimal fan efficiency.

16. The motor drive of claim 15, wherein the air directing structure provides a specified air flow resistance configured to cause the fan to operate at or near the optimal fan efficiency.

17. The motor drive of claim 15, wherein the air directing structure is configured to permit cooling air to flow to a region of the air passageway adjacent to the power conditioning circuitry.

18. The motor drive of claim 15, wherein the air directing structure includes a plurality of fins disposed adjacent to fins of the heat dissipating structure.

19. The motor drive of claim 18, wherein the air directing structure includes a moldable plastic element of which the plurality of fins are an integral part.

20. The motor drive of claim 15, wherein the air directing structure includes a mesh.

* * * * *